(12) United States Patent
Hung

(10) Patent No.: US 10,627,556 B2
(45) Date of Patent: Apr. 21, 2020

(54) ELECTRONIC DEVICES WITH OPTICAL COMPONENT WINDOWS

(71) Applicant: Apple Inc., Cupertino, CA (US)

(72) Inventor: Po-Chieh Hung, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 124 days.

(21) Appl. No.: 15/699,949

(22) Filed: Sep. 8, 2017

(65) Prior Publication Data

US 2019/0079236 A1 Mar. 14, 2019

(51) Int. Cl.
| | | |
|---|---|---|
| *G02B 5/30* | (2006.01) | |
| *H01L 51/52* | (2006.01) | |
| *H01L 27/32* | (2006.01) | |
| *G02F 1/13363* | (2006.01) | |
| *G02F 1/1335* | (2006.01) | |
| *G02F 1/133* | (2006.01) | |
| *G02F 1/1333* | (2006.01) | |

(52) U.S. Cl.
CPC ....... *G02B 5/3083* (2013.01); *G02F 1/13318* (2013.01); *G02F 1/13363* (2013.01); *G02F 1/133555* (2013.01); *H01L 27/3225* (2013.01); *H01L 27/3227* (2013.01); *H01L 27/3234* (2013.01); *H01L 51/524* (2013.01); *H01L 51/5237* (2013.01); *H01L 51/5253* (2013.01); *H01L 51/5271* (2013.01); *H01L 51/5281* (2013.01); *G02F 1/133528* (2013.01); *G02F 2001/133331* (2013.01); *G02F 2001/133388* (2013.01); *G02F 2001/133638* (2013.01); *G02F 2203/055* (2013.01); *G02F 2413/02* (2013.01); *H01L 27/323* (2013.01)

(58) Field of Classification Search
CPC ............. G02B 5/3083; G02F 1/133528; G02F 1/133555; G02F 1/13363; G02F 2001/133388; G02F 2001/133638; G02F 2203/055; G02F 2413/02; H01L 27/3225; H01L 27/3227; H01L 27/323; H01L 27/3234; H01L 51/524; H01L 51/5253; H01L 51/5271; H01L 51/5281
See application file for complete search history.

(56) References Cited

U.S. PATENT DOCUMENTS

| | | |
|---|---|---|
| 6,952,245 B2 | 10/2005 | Sugino et al. |
| 7,248,331 B2 | 7/2007 | Miyatake et al. |
| 7,515,336 B2 | 4/2009 | Lippey et al. |

(Continued)

*Primary Examiner* — Marcus H Taningco
(74) *Attorney, Agent, or Firm* — Treyz Law Group, P.C.; G. Victor Treyz; David K. Cole

(57) ABSTRACT

An electronic device may be provided with a display mounted in a housing. The display may have an array of pixels that form an active area and may have an inactive area that runs along an edge of the active area. An opaque layer may be formed on an inner surface of a display cover layer in the inactive area of the display or may be formed on another transparent layer in the electronic device. An optical component window may be formed from the opening and may be aligned with an optical component such as a proximity sensor, ambient light sensor, image sensor, or light source. The optical component window may have a quarter wave plate, a linear polarizer interposed between the transparent layer and the quarter wave plate, and a partially reflective mirror interposed between the optical component and the quarter wave plate.

22 Claims, 9 Drawing Sheets

(56) References Cited

U.S. PATENT DOCUMENTS

| | | | |
|---|---|---|---|
| 7,520,642 B2 | 4/2009 | Holman et al. | |
| 2012/0243091 A1* | 9/2012 | Amm | G06F 1/1605 |
| | | | 359/489.07 |
| 2014/0022491 A1* | 1/2014 | Wiendorf | G02F 1/133617 |
| | | | 349/62 |
| 2015/0102212 A1* | 4/2015 | Ruh | G01J 1/0474 |
| | | | 250/237 R |
| 2015/0122978 A1* | 5/2015 | deJong | G01J 1/4204 |
| | | | 250/225 |
| 2016/0238765 A1* | 8/2016 | Zhang | G02B 5/305 |
| 2016/0274361 A1 | 9/2016 | Border et al. | |
| 2017/0068029 A1* | 3/2017 | Yun | G02B 5/3025 |

\* cited by examiner

ELECTRONIC DEVICES WITH OPTICAL COMPONENT WINDOWS

FIELD

This relates generally to electronic devices, and, more particularly, to electronic devices with optical components.

BACKGROUND

Electronic devices such as laptop computers, cellular telephones, and other equipment are sometimes provided with optical components. For example, an electronic device may have an ambient light sensor, an optical proximity sensor, image sensors, light sources, and other optical components.

In an electronic device with a display, display border regions are often provided with opaque borders. The use of opaque borders helps hide internal components from view.

To accommodate optical component in the opaque border region of an electronic device display, optical component window regions may be formed in an opaque region such as an opaque display border region. In some arrangements, clear windows may be formed. Clear windows exhibit good light transmission, but are highly visible within the opaque display border region and can therefore be unsightly.

To help visually match the appearance of optical component windows to surrounding opaque border material, optical component windows can be formed from dark window coatings such as polymer layers containing dark dye or pigment. Dark window coatings may exhibit a dark outward appearance that matches nearby opaque border material while allowing light to pass through the window coating to accommodate an optical component.

The amount of light that is transmitted through an optical window with a dark window coating can be relatively small (e.g., 5%), which can adversely affect optical component performance. For example, light sensor noise may be higher than desired due to the relatively small amount of light that is transmitted. Although the light transmission level of a dark window coating could be increased to enhance sensor performance by thinning the dark window coating, this would make the window coating lighter in appearance and therefore less able to match the appearance of surrounding opaque border material.

SUMMARY

An electronic device may be provided with a display mounted in a housing. The display may have an array of pixels that form an active area and may have an inactive area along an edge of the active area. An opaque layer may be formed on an inner surface of a display cover layer in the inactive area of the display. The opaque layer may be formed from black ink or other opaque masking material that helps hide internal components from view.

An optical component window may be formed from an opening in the opaque layer. The optical component window may be aligned with an optical component such as a proximity sensor, ambient light sensor, image sensor, or light source in the electronic device. The optical component window may exhibit high light transmittance and low reflectance, so that the optical component window has a dark appearance that matches the appearance of surrounding portions of the opaque masking material.

In an illustrative configuration, the optical component window has a quarter wave plate, a linear polarizer interposed between the display cover layer and the quarter wave plate, and a partially reflective mirror interposed between the optical component and the quarter wave plate.

DETAILED DESCRIPTION

Figure 1:
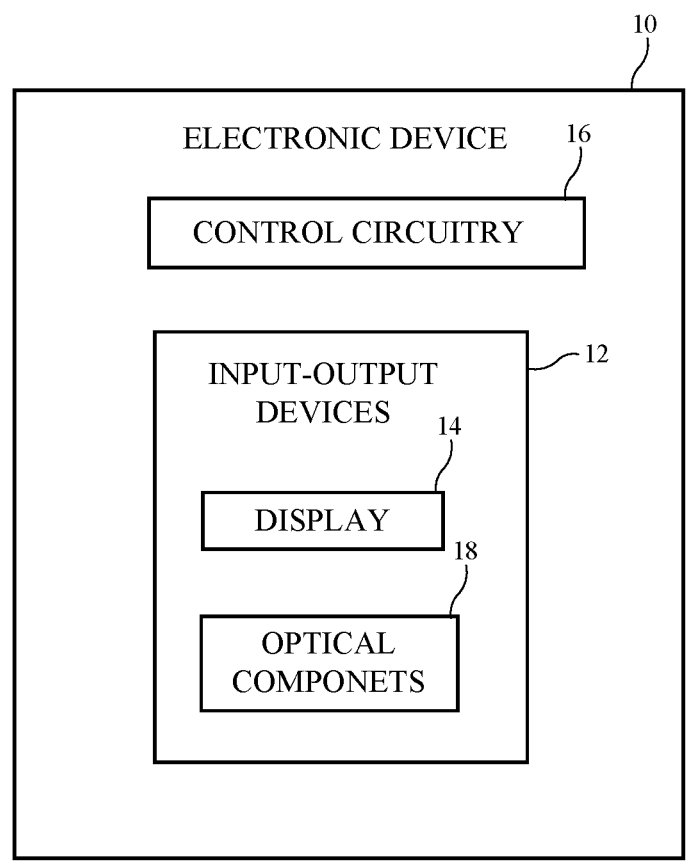
FIG. 1 is a schematic diagram of an illustrative electronic device having optical components in accordance with an embodiment.

An illustrative electronic device of the type that may be provided with optical components is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Device 10 may have input-output circuitry such as input-output devices 12. Input-output devices 12 may include user input devices that gather user input and output components that provide a user with output. Devices 12 may also include communications circuitry that receives data for device 10 and that supplies data from device 10 to external devices and may include sensors that gather information from the environment.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. Display 14 may be a liquid crystal display, a light-emitting diode display (e.g., an organic light-emitting diode display), an electrophoretic display, or other display.

Input-output devices 12 may include optical components 18. Optical components 18 may include ambient light sensors (e.g., color ambient light sensors configured to measure ambient light color and intensity by making light measurements with multiple light detector channels each of which has a corresponding photodetector that responds to light in a different wavelength band), optical proximity sensors (e.g., sensors with a light-emitting device such as an infrared light-emitting diode and a corresponding light detector such as an infrared photodiode for detecting when an external object that is illuminated by infrared light from the light-emitting diode is in the vicinity of device 10), a visible light camera, an infrared light camera, light-emitting diodes that emit flash illumination for visible light cameras, infrared light-emitting diodes that emit illumination for infrared cameras, and/or other optical components.

In addition to optical components 18, input-output devices 12 may include buttons, joysticks, scrolling wheels, touch pads, key pads, keyboards, microphones, speakers, tone generators, vibrators, cameras, light-emitting diodes and other status indicators, non-optical sensors (e.g., temperature sensors, microphones, capacitive touch sensors, force sensors, gas sensors, pressure sensors, sensors that monitor device orientation and motion such as inertial measurement units formed from accelerometers, compasses, and/or gyroscopes), data ports, etc. A user can control the operation of device 10 by supplying commands through input-output devices 12 and may receive status information and other output from device 10 using the output resources of input-output devices 12.

Figure 2:
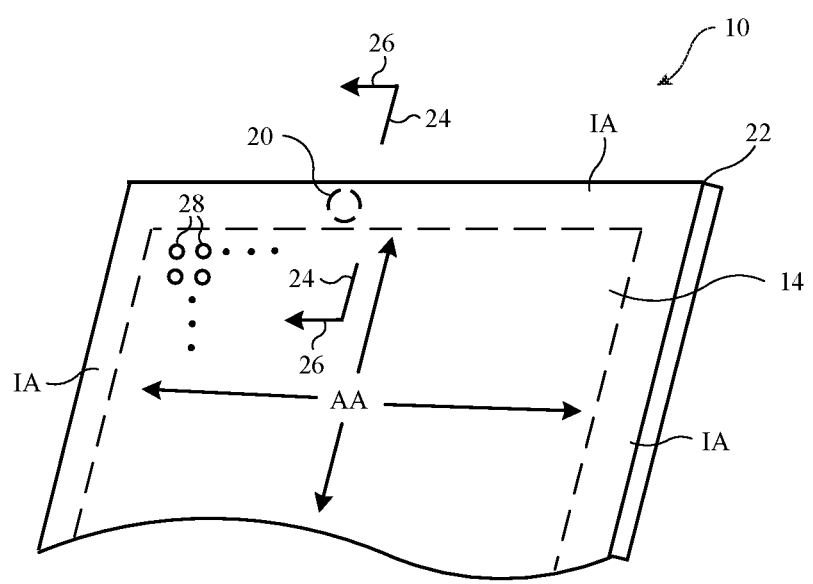
FIG. 2 is a perspective view of a portion of an electronic device display having an optical component window overlapping an optical component in accordance with an embodiment.

Device 10 may have a housing. The housing may form a laptop computer enclosure, an enclosure for a wristwatch, a cellular telephone enclosure, a tablet computer enclosure, or other suitable device enclosure. A perspective view of a portion of an illustrative electronic device is shown in FIG. 2. In the example of FIG. 2, device 10 includes a display such as display 14 mounted in housing 22. Housing 22, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 22 may be formed using a unibody configuration in which some or all of housing 22 is machined or molded as a single structure or may be formed using multiple structures (e.g., an internal frame structure, one or more structures that form exterior housing surfaces, etc.).

Display 14 may be protected using a display cover layer such as a layer of transparent glass, clear plastic, sapphire, or other clear layer (e.g., a transparent planar member that forms some or all of a front face of device 10 or that is mounted in other portions of device 10). Openings may be formed in the display cover layer. For example, an opening may be formed in the display cover layer to accommodate a button, a speaker port, or other components. Openings may be formed in housing 22 to form communications ports (e.g., an audio jack port, a digital data port, etc.), to form openings for buttons, etc. In some configurations, housing 22 may have a rear housing wall formed from a planar glass member or other transparent layer (e.g., a planar member formed on a rear face of device 10 opposing a front face of device 10 that includes a display cover layer). The planar member forming the rear housing wall may have an interior surface that is coated with an opaque masking layer.

Display 14 may have an array of pixels 28 in active area AA (e.g., liquid crystal display pixels, organic light-emitting diode pixels, electrophoretic display pixels, etc.). Pixels 28 of active area AA may display images for a user of device 10. Active area AA may be rectangular or may have other suitable shapes.

Inactive portions of display 14 such as inactive border area IA may be formed along one or more edges of active area AA. Inactive border area IA may overlap circuits, signal lines, and other structures that do not emit light for forming images. To hide inactive circuitry and other components in border area IA from view by a user of device 10, the underside of the outermost layer of display 14 (e.g., the display cover layer or other display layer) may be coated with an opaque masking material such as a layer of black ink (e.g., polymer containing black dye and/or black pigment, opaque materials of other colors, etc.) and/or other layers (e.g., metal, dielectric, semiconductor, etc.). Opaque masking materials such as these may also be formed on an inner surface of a planar rear housing wall formed from glass, ceramic, polymer, crystalline transparent materials such as sapphire, or other transparent material.

Optical components (e.g., a camera, a light-based proximity sensor, an ambient light sensor, status indicator light-emitting diodes, camera flash light-emitting diodes, etc.) may be mounted under one or more optical component windows such as optical component window 20 of FIG. 2. In the example of FIG. 2, optical component window 20 is formed in inactive area IA of display 14 (e.g., an inactive border area in a display cover layer). If desired, optical component windows such as window 20 may be formed in other portions of device 10 such as portions of a rear housing wall formed from a transparent member coated with opaque masking material. Arrangements in which optical component windows such as window 20 are formed in portions of a display cover layer for display 14 may sometimes be described herein as examples.

In an arrangement of the type shown in FIG. 2, one or more openings for one or more respective optical component windows such as optical component window 20 may be formed in the opaque masking layer of inactive area IA to accommodate the optical components. A polarizer layer and other structures may overlap the openings to adjust the appearance of the optical component windows (e.g., to adjust the appearance of the optical component windows so that the optical component windows have appearances that match the surrounding opaque masking layer).

Optical component windows may, in general, include any suitable layer(s) of material (e.g., ink, polarizer material, retarder films, partially transparent metal films, dielectric coating layers such as thin-film interference filter coatings formed from stacks of dielectric materials, etc.). With one illustrative configuration, an optical component window may be formed from a polarizer layer (e.g., a linear polarizer), a birefringent retarder layer such as a quarter wave plate, and a partial mirror (e.g., a mirror with a reflectivity of 10-60%). The linear polarizer may, for example, be located adjacent to an inner surface of a display cover layer. The quarter wave plate may be interposed between the linear polarizer and the partial mirror. The partial mirror may be interposed between an optical component that is aligned with the optical component window and the quarter wave plate. Together, the linear polarizer and the quarter wave plate may form a circular polarizer that helps suppress light reflections from the partial mirror. This provides the optical component window with a dark appearance that can be well matched to surrounding opaque masking material in the inactive area of display 14. At the same time, light transmission through this type of optical component window may be relatively high when compared to conventional window designs using dark ink.

Figure 3:
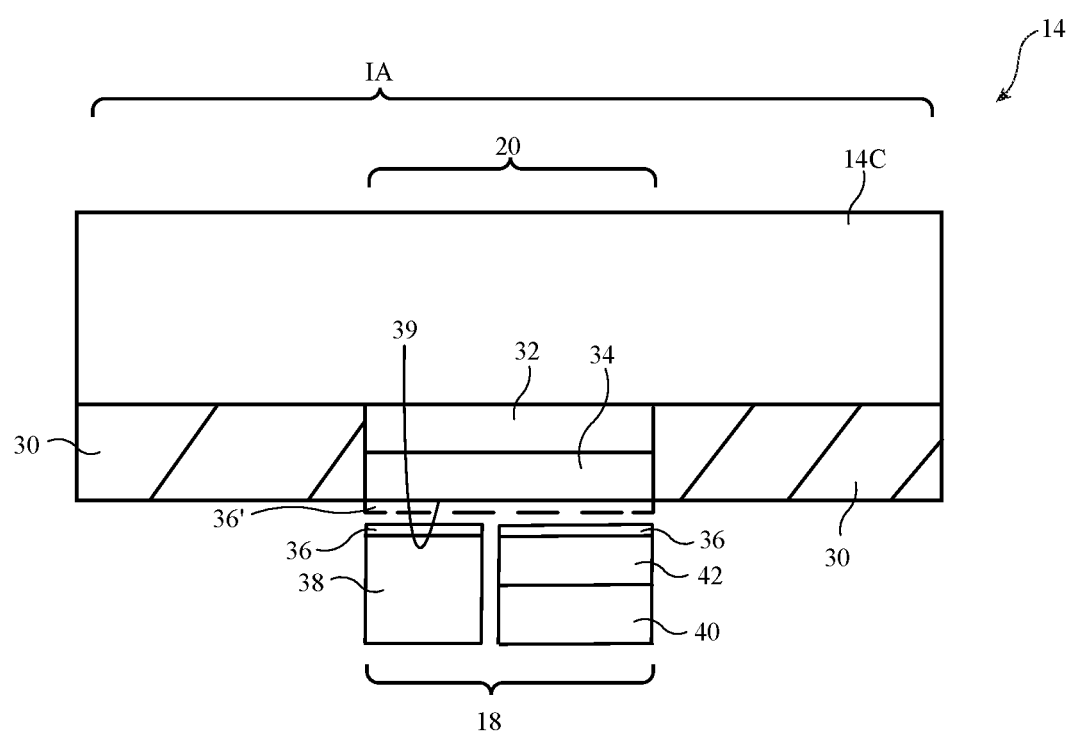
FIG. 3 is a cross-sectional side view of an illustrative optical component window overlapping an optical component in accordance with an embodiment.

FIG. 3 is a cross-sectional side view of display 14 of FIG. 2 taken along line 24 through optical component window 20 and viewed in direction 26 of FIG. 2. As shown in FIG. 3, display 14 may have a display cover layer such as display cover layer 14C. Display cover layer 14C may have a portion that covers active area AA of display 14 and a portion such as the portion shown in FIG. 3 that covers inactive area IA. Window 20 may be formed from an opening in opaque masking layer 30 on the inner surface of display cover layer 14C in inactive area IA. Layer 14C may be formed from glass, plastic, ceramic, sapphire, or other transparent materials and may be a part of display 14 or a separate protective layer that covers active display structures.

The opening associated with window 20 may be covered with window structures such as linear polarizer layer 32 and a birefringent retarder layer such as quarter wave plate 34. These layers may overlap partial mirror 36. Partial mirror 36 may be formed in one or more sections on optical component 18, may be formed on a stand-alone substrate (e.g., a polymer film), and/or may be formed as a coating on inner surface 39 of quarter wave plate 34 in position 36'. Partial mirror 36 may be formed from reflective structures such as metal and/or a thin-film interference filter formed from a stack of dielectric layers (e.g., dielectric layers with alternating index of refraction values). The reflectivity of mirror 36 may be, for example, 10-60%, at least 15%, at least 20%, less than 60%, or other suitable value.

When device 10 is exposed to unpolarized ambient light, the unpolarized ambient light will pass through linear polarizer 32. Linear polarizer 32 linearly polarizes the ambient light. Quarter wave plate 34 converts this incoming linearly polarized ambient light to circularly polarized light. Partial mirror 36 reflects the incoming circularly polarized light outward. As the reflected circularly polarized light passes outwardly through quarter wave plate 34, quarter wave plate 34 converts this circularly polarized light to linearly polarized light that is polarized perpendicular to the pass axis of linear polarizer 32. As a result, all or at least some of the reflected light will be blocked, providing window 20 with a black (dark) appearance matching that of opaque masking layer 30.

A fraction of the incoming light that strikes partial mirror 36 passes through mirror 36 and can be received and used by optical component 18. The partial transparency of mirror 36 also allows light to be transmitted outwardly from component 18.

Light transmission for window 20 may be significantly higher than conventional partially transparent black ink window coating layers of comparable (or even higher) reflectivity values. For example, consider a scenario in which linear polarizer 32 has a 40% transmittance for unpolarized light and a 5% transmittance for light that is polarized perpendicular to the pass axis of linear polarizer 32, in which quarter wave plate 34 has an 80% transmittance, in which partial mirror 36 has a 50% transmittance and 40% reflectance, and in which layer 14C exhibits a reflectivity of 0.5%. In this scenario, total light reflection will be 40%*80%*40%*80%*5%+0.5%=1.1% or less, which is less than the total light reflection of 1.8% associated with conventional partially transparent black ink window coatings of 5% transmittance) and light transmission will be 40%*80%*50%=16%, which is significantly greater than the 5% light transmission available with conventional black ink of 1.8% reflectivity. As a result of this increased light transmission through window 20, the signal-to-noise ratio when sensing light with component 18 may be enhanced.

Optical component 18 of FIG. 3 may be any suitable component aligned with window 20 that emits and/or detects light (e.g., an ambient light sensor, an optical proximity sensor, an image sensor, a light-emitting diode or other light source, etc.). In the example of FIG. 3, optical component 18 is an infrared proximity sensor having an infrared light-emitting diode or other light source 38. During operation, light source 38 emits infrared light that passes through window 20 and reflects from nearby external objects (e.g., the face of a user, etc.). Reflected portions of the emitted infrared light pass back through window 20 and are detected by a light detector such as an infrared photodiode or other light sensor 40. Diffuser 42 may help diffuse incoming light and thereby reduce the impact of light ray directionality during sensing. If desired, partial mirror 36 may be formed on the upper surface of diffuser 42.

Other configurations for component 18 may be used, if desired. In configurations in which light sensor 40 is a visible light or infrared light digital image sensor, diffuser 42 may be omitted and light source 38 may emit visible light (e.g., camera flash light for a visible image sensor) or infrared light (e.g., infrared illumination for an infrared image sensor). Arrangements in which light sensor 40 is a digital image sensor and in which light-emitting components such as light source 38 are omitted may also be used. In configurations in which light sensor 40 is an ambient light sensor, light source 38 may be omitted or may be placed elsewhere in device 10. A monochrome ambient light sensor may be sensitive to light intensity. A color ambient light sensor may contain multiple photodiodes each of which has an overlapping bandpass filter or other light filtering structure that passes a particular color (range of colors) of light to that photodiode. For example, a color ambient light sensor may have a red photodiode that is sensitive to red light, a green photodiode that is sensitive to green light, and a blue photodiode that is sensitive to blue light. Additional channels may also be incorporated into a color ambient light sensor. During operation, ambient light color (e.g., color coordinates, color temperature data, etc.) can be measured and ambient light intensity may be measured through window 20.

In general, device 10 may have one or more windows such as illustrative window 20 of FIG. 3 and each window may overlap one or more optical components. The configuration of FIG. 3 in which a single optical proximity sensor is overlapped by a single optical component window 20 in device 10 is merely illustrative.

Window 20 may be formed from an opening in opaque masking layer (opaque layer) 30 that is aligned with component 18. This allows light from light source 38 to pass from the interior of device 10 to the exterior of device 10 through window 20 and/or allows exterior light that enters device 10 through window 20 to reach component 18.

The opening may be circular (e.g., window 20 may have a circular footprint when viewed from above), may be oval, may be rectangular, may have one or more discontinuous openings (e.g., perforations), or may have other suitable shapes. Opaque layer 30 may be formed on the inner (inwardly facing) surface of display cover layer 14C in inactive region IA to help hide internal components (e.g., metal traces, integrated circuits, etc.) from view. Opaque masking layer 30 may be formed from one or more ink layers (e.g., black ink, gray ink, ink of other neutral and/or non-neutral colors, etc.) and/or other layers of material (semiconductor, metal, inorganic or organic dielectric materials, etc.). As an example, layer 30 may be formed from black ink and the appearance of window 20 may be black to match the black appearance of surrounding layer 30.

Figure 4:
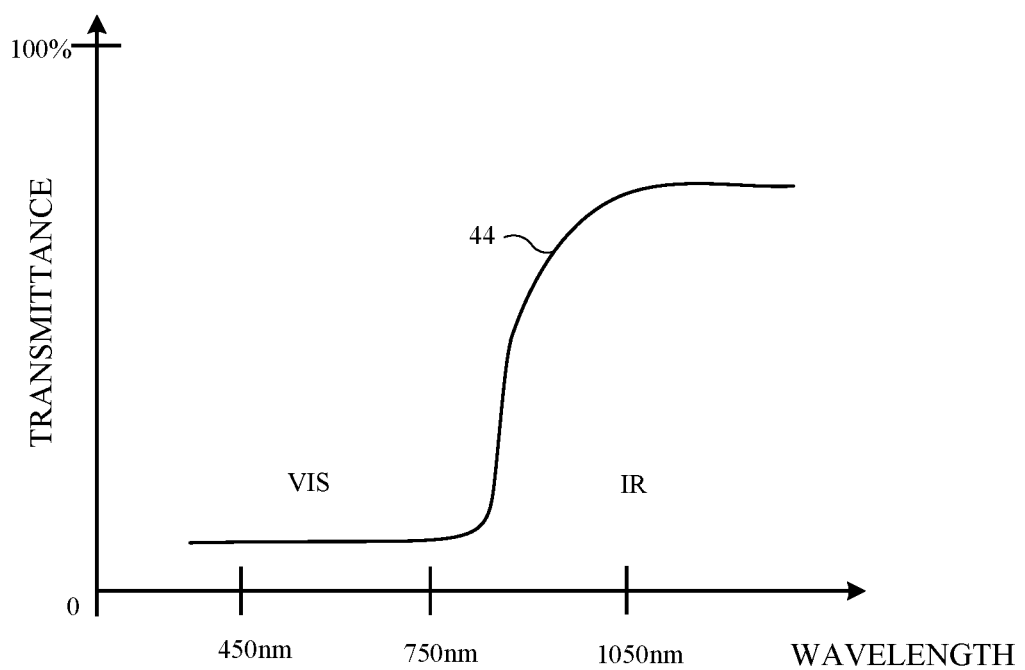
FIG. 4 is a graph in which light transmittance has been plotted as a function of wavelength for an illustrative optical component window in accordance with an embodiment.

In configurations in which component 18 operates with infrared light (e.g., light with a wavelength of at least 800 nm, at least 900 nm, 700-1000 nm, or other suitable infrared light wavelength), the polarization strength of linear polarizer 32 will be lowered for the infrared light and transmission of unpolarized light through linear polarizer 32 will be relatively high for the infrared light (e.g., at least 60%, at least 70%, at least 80%, etc.). This is illustrated by curve 44 of FIG. 4, which shows an illustrative light transmission (T) versus wavelength characteristic for linear polarizer 32 (e.g., a polymer film linear polarizer) at both visible (VIS) and infrared (IR) wavelengths. As a result, the transmission of optical window 20 for infrared wavelengths associated with infrared optical component 18 may be greater than the transmission of optical window 20 for visible wavelengths.

Figure 5:
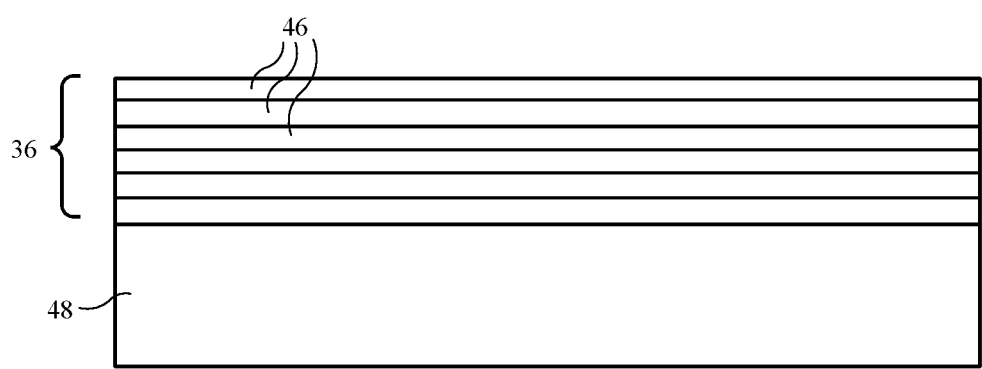
FIG. 5 is a cross-sectional side view of a partial mirror formed from a thin-film interference filter having a stack of dielectric thin-film layers on a substrate in accordance with an embodiment.
Figure 6:
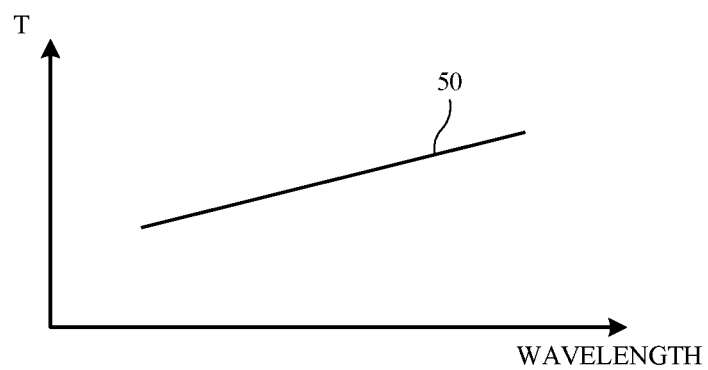
FIG. 6 is a graph showing how a layer such as a quarter wave plate in an optical component window may exhibit a wavelength-dependent transmittance in accordance with an embodiment.
Figure 7:
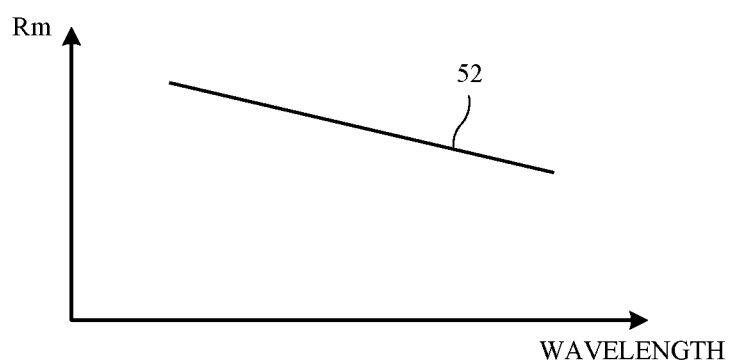
FIG. 7 is a graph showing how a partial mirror in an optical component window may exhibit a compensating wavelength-dependent reflectivity in accordance with an embodiment.
Figure 8:
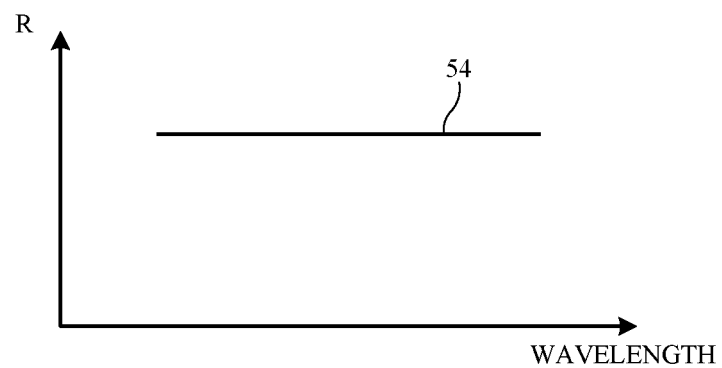
FIG. 8 is a graph showing how the reflectivity of an optical component window may be insensitive to wavelength when formed using a quarter wave plate with a transmission spectrum of the type shown in FIG. 6 and a partial mirror with a reflection spectrum of the type shown in FIG. 7 in accordance with an embodiment.

FIG. 5 is a cross-sectional side view of reflective mirror 36 in an illustrative configuration in which partially reflective mirror 36 has been formed from a stack of dielectric thin-film layers 46 on substrate 48. Substrate 48 may be formed from glass, transparent polymer, or other transparent substrate material. Substrate 48 may be a stand-alone substrate layer, a portion of quarter wave plate 34, a portion of diffuser 42, or other suitable supporting structure for mirror 36. Layers 46 may form a thin-film interference filter (e.g., a partially reflective mirror having a reflectivity of 10-60% or other suitable reflectivity value and a desired spectral shape) and may be formed on one or both sides of substrate 48. Layers 46 may each be less than 2 microns in thickness, less than 1 micron in thickness, or other suitable thickness and may be configured to alternate refractive index (e.g., layers 46 may include alternating layers of higher and lower refractive index values). There may be at least 5, at least 10, at least 20, fewer than 100, or other suitable number of thin-film layers 46 in partially reflective mirror 36. Layers 46 may be inorganic dielectric layers (e.g., silicon oxide, niobium oxide, aluminum oxide, silicon nitride, tantalum oxide, titanium oxide, etc.) and/or may include organic dielectric layers. In some arrangements, quarter wave plate 34 may be non-achromatic. As a result, the round-trip or bouncing light (light that has reflected off of reflective mirror 36 and passed through quarter wave plate 34 twice) changes its angle of polarization by 90° only for a specific wavelength and not other wavelengths. For the light at other wavelengths, a non-zero amount of light will therefore pass through the linear polarizer. The overall transmission spectrum (e.g., transmission spectrum curve 50 of FIG. 6) will not be flat due to the wavelength-dependent bouncing light transmission spectrum associated with the light that passes twice through the quarter wave plate. To ensure that window 20 has a desired appearance (e.g., a neutral color appearance), partially reflective mirror 36 may be configured to exhibit a compensating reflection spectrum (e.g., a wavelength-dependent reflection spectrum that compensates for the wavelength-dependent bouncing light transmission spectrum), as shown by reflection spectrum curve 50 of FIG. 7. The desired reflectivity R of mirror 36 at each wavelength of interest (e.g., at visible wavelengths of 400-700 nm) can be obtained by adjusting the thin-film interference filter formed from the stack of dielectric thin-film layers 46 and/or by appropriate selection of the metal or other material used in forming a metal partially reflective mirror structure for mirror 36. For example, the reflectivity R of mirror 36 may be configured to exhibit wavelength-dependent variations (a non-flat reflection spectrum) to balance wavelength-dependent variations in transmission T of quarter wave plate 34. The resulting total reflection of polarizer 32, wave plate 34, and mirror 36 (e.g., the total reflection from the window structures overlapping the opening in masking layer 30 for window 20) may be spectrally flat (or may have any other desired shape), as illustrated by flat reflection spectrum R (curve 54) in FIG. 8. If desired, the spectral properties of display cover layer 14C and/or other structures overlapping window 20 may also be taken into account when configuring the reflection spectrum of mirror 36. To compensate for spectral changes to transmitted light that is being sensed by component 18, component 18 may be calibrated during manufacturing (e.g., using test equipment). If desired, a flat reflection spectrum for window 20 may be produced by using an achromatic quarter wave plate (e.g., a quarter wave plate that has a flat visible light transmission spectrum).

Figure 9:
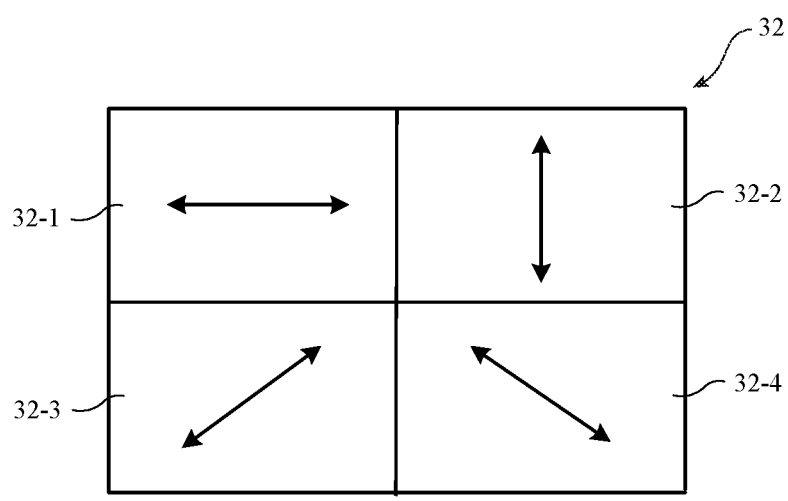
FIG. 9 is a top view of an illustrative polarizer pattern that may be incorporated into optical windows in accordance with an embodiment.

To accommodate situations in which ambient light in the vicinity of device 10 is linearly polarized (e.g., in the presence of strong reflections from reflective building surfaces or water), areas of linear polarizer 32 may be provided with multiple different orientations. As shown in FIG. 9, for example, linear polarizer 32 may be segmented and may have portions 32-1, 32-2, 32-3, and 32-4 with different respective pass axis orientations. These different segmented portions may all be incorporated into a single window 20 or multiple windows 20 may be formed each of which has an associated underlying component 18 and/or which collectively overlap a light sensing region associated with a single component 18. If desired, the effective of the orientation of the linear polarizer can be reduced by placing an additional quarter wave plate (e.g., a wave plate such as wave plate 34) on top of polarizer 32, so that polarizer 32 is sandwiched between two quarter wave plates, thereby reducing the linear polarizing effect and simplifying the structure. Because of the orientation diversity provided by using multiple polarizer and quarter wave plate orientations of the type shown in FIG. 9 (and/or because of the reduced effect of the linear polarizer due to the presence of the additional quarter wave plate), devices that include this type of optical component window 20 will be relatively insensitive to ambient light polarization effects.

Figure 10:
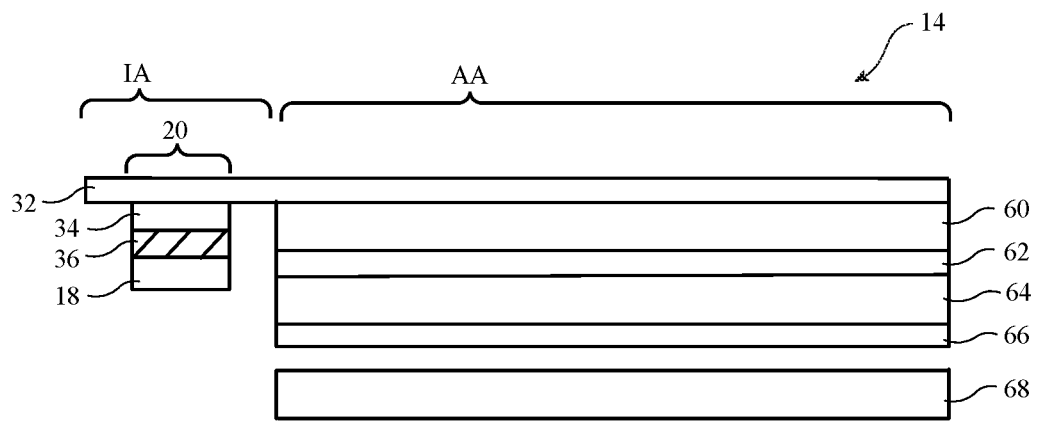
FIG. 10 is a cross-sectional side view of an illustrative optical window formed from a polarizer that forms part of a liquid crystal display in accordance with an embodiment.

FIG. 10 shows how window 20 may overlap a portion of a linear polarizer that is being used as an upper polarizer layer in a liquid crystal display. The liquid crystal display of FIG. 10 includes upper polarizer (linear polarizer) 32 and lower polarizer layer 66. In active area AA, color filter layer 60 and thin-film transistor layer 64 may be formed between upper polarizer 32 and lower polarizer 66. Liquid crystal layer 62 may be interposed between layers 60 and 64. This forms an array of liquid crystal display pixels in active area AA. In inactive area IA, window 20 overlaps a portion of linear polarizer 32 (e.g., the same linear polarizer layer that forms the upper polarizer layer for the array of liquid crystal display pixels in active area AA). Quarter wave plate 34 may be interposed between partially reflective mirror 36 and linear polarizer 32 in window 20. Partially reflective mirror 36 may be located between quarter wave plate 34 and optical component 18. Opaque masking material with an opening for window 20 and a display cover layer can be incorporated into display 14 of FIG. 10 to hide internal components from view and to protect display 14.

Figure 11:
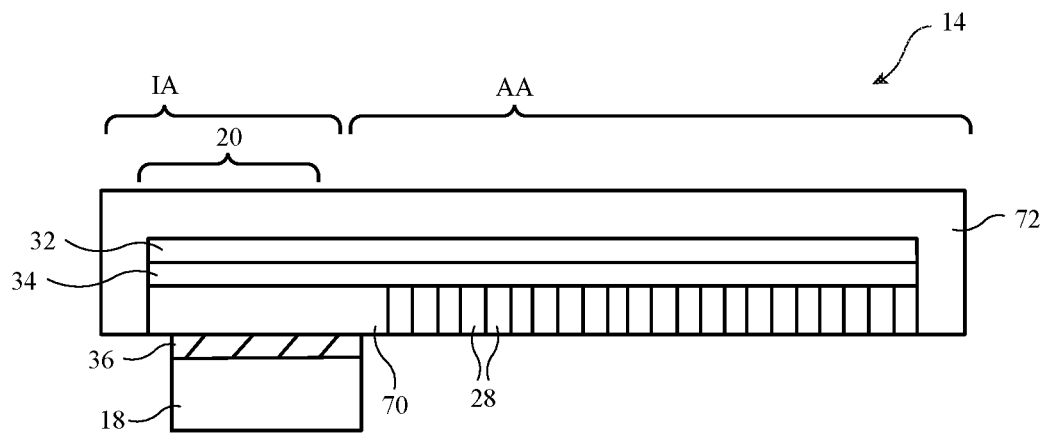
FIG. 11 is a cross-sectional side view of an illustrative organic light-emitting diode display having a window region that overlaps an optical component in accordance with an embodiment.

FIG. 11 shows how optical component window 20 may overlap a portion of an organic light-emitting diode display. Display 14 of FIG. 11 may have an array of organic light-emitting diode pixels 28 in active area AA. Quarter wave plate 34 and linear polarizer 32 may overlap pixels 28 in active area AA (e.g., to suppress reflections from reflective structures in active area AA, etc.). Encapsulant 72 may cover these layers. In inactive area IA, a portion of the same quarter wave plate layer 34 that overlaps pixels 28 in active area AA may overlap window 20 and a portion of the same linear polarizer layer 32 that overlaps pixels 28 in active area AA may overlap window 20. Portion 70 of the thin-film structures making up the organic light-emitting diode may be transparent (e.g., by omitting thin-film transistors, metal traces, organic emissive material, and other opaque structures from this portion of display 14). This allows light that passes through window 20 to reach optical component 18, which is aligned with portion 70 and window 20. Partially reflective mirror 36 may be interposed between portion 70 and optical component 18. Opaque masking material and a cover layer can be incorporated into display 14 of FIG. 11 to hide internal components from view and to protect display 14. An opening in the opaque masking layer may be formed for window 20.

Figure 12:
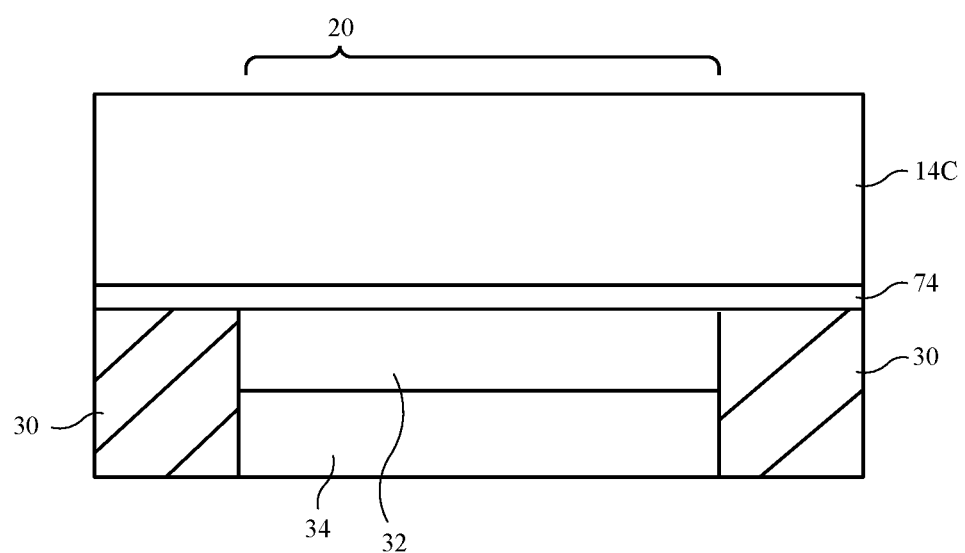
FIG. 12 is a cross-sectional side view of an illustrative optical window having a layer of ink interposed between a display cover layer and a linear polarizer in the optical window in accordance with an embodiment.

FIG. 12 shows how a layer of material such as layer 74 may be interposed between display cover layer 14C and linear polarizer 32. Layer 74 may be a layer of ink or other material that adjusts the appearance of optical component window 20. Because linear polarizer 32 and quarter wave plate 34 are present and help to darken the appearance of window 20, layer 74 may be relatively thin (e.g., less than 20 microns, less than 5 microns, etc.).

The foregoing is merely illustrative and various modifications can be made to the described embodiments. The foregoing embodiments may be implemented individually or in any combination.

What is claimed is:

1. An electronic device, comprising:
   a housing;
   a display coupled to the housing that has an active area with an array of pixels, that has an inactive area without pixels, and that has a display cover layer overlapping the active area and the inactive area;
   an opaque masking layer on a surface of the display cover layer in the inactive area;
   an optical component; and
   an optical component window formed from an opening in the opaque masking layer in the inactive area and aligned with the optical component, wherein the optical component window includes a quarter wave plate, a linear polarizer between the quarter wave plate and the display cover layer, and a partially reflective mirror between the optical component and the quarter wave plate, wherein the partially reflective mirror has a maximum transmittance of 10-60% across visible wavelengths.

2. The electronic device defined in claim 1 wherein the optical component includes a light sensor and a diffuser between the light sensor and the partially reflective mirror.

3. The electronic device defined in claim 1 wherein light passing through the quarter wave plate exhibits a wavelength-dependent bouncing light transmission spectrum and wherein the partially reflective mirror is configured to exhibit a wavelength-dependent reflection spectrum that compensates for the wavelength-dependent bouncing light transmission spectrum and provides the optical component window with a wavelength-insensitive visible light reflection spectrum.

4. The electronic device defined in claim 1 wherein the optical component comprises at least one light detector configured to detect light, wherein the linear polarizer has multiple portions with different respective pass axis orientations, and wherein the light passes through the multiple portions.

5. The electronic device defined in claim 1 further comprising an additional quarter wave plate, wherein the linear polarizer is sandwiched between the quarter wave plate and the additional quarter wave plate.

6. The electronic device defined in claim 1 wherein the quarter wave plate comprises an achromatic quarter wave plate.

7. The electronic device defined in claim 1 wherein the linear polarizer overlaps the array of pixels.

8. The electronic device defined in claim 1 wherein the quarter wave plate overlaps the array of pixels.

9. The electronic device defined in claim 8 wherein the array of pixels comprises organic light-emitting diode pixels and wherein the linear polarizer overlaps the array of pixels.

10. The electronic device defined in claim 1 wherein the optical component comprises a light sensor.

11. The electronic device defined in claim 10 wherein the optical component comprises a light source.

12. The electronic device defined in claim 11 wherein the light source comprises an infrared light-emitting diode.

13. The electronic device defined in claim 1 wherein the optical component comprises an image sensor.

14. The electronic device defined in claim 1 wherein the optical component comprises a color ambient light sensor.

15. An electronic device, comprising:
   a transparent layer;
   a quarter wave plate;
   a linear polarizer interposed between the transparent layer and the quarter wave plate; and an optical component, wherein the optical component is configured to detect first portions of incoming ambient light that pass through the transparent layer, the quarter wave plate, and the linear polarizer; and a partially reflective mirror interposed between the optical component and the quarter wave plate, wherein the partially reflective mirror reflects second portions of the incoming ambient light across visible wavelengths.

16. The electronic device defined in claim 15 further comprising:

a layer of opaque material on the transparent layer having an optical component window opening aligned with the optical component.

17. The electronic device defined in claim 16 further comprising:

an array of pixels configured to display images, wherein the transparent layer has a portion that overlaps the array of pixels.

18. The electronic device defined in claim 17 wherein the optical component comprises an optical component selected from the group consisting of: an ambient light sensor, an optical proximity sensor, a visible light image sensor; and an infrared image sensor.

19. The electronic device defined in claim 15 wherein the optical component comprises a light sensor that is configured to measure light received through the transparent layer, the linear polarizer, the quarter wave plate, and the partially reflective mirror.

20. An electronic device, comprising:

an array of pixels configured to display images;

a transparent layer overlapping the array of pixels;

an opaque layer on a surface of a portion of the transparent layer that is not overlapping the array of pixels, wherein the opaque layer has an opening;

a quarter wave plate;

a linear polarizer overlapping the opening and interposed between the quarter wave plate and the transparent layer;

an optical component aligned with the opening; and a partially reflective mirror between the optical component and the linear polarizer, wherein the partially reflective mirror is configured to reflect portions of ambient light prior to the ambient light passing entirely through the partially reflective mirror.

21. The electronic device defined in claim 20 wherein the partially reflective mirror comprises a stack of thin-film dielectric layers.

22. The electronic device defined in claim 20 wherein the optical component comprises a diffuser and a light sensor configured to receive light through the diffuser and wherein the partially reflective mirror comprises a metal layer on the diffuser.

* * * * *